United States Patent
Chen et al.

(10) Patent No.: US 7,211,503 B2
(45) Date of Patent: May 1, 2007

(54) ELECTRONIC DEVICES FABRICATED BY USE OF RANDOM CONNECTIONS

(75) Inventors: Yong Chen, Sherman Oaks, CA (US); Tad Hogg, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 282 days.

(21) Appl. No.: 11/065,929

(22) Filed: Feb. 24, 2005

(65) Prior Publication Data

US 2006/0189112 A1    Aug. 24, 2006

(51) Int. Cl.
*H01L 21/44* (2006.01)
(52) U.S. Cl. ............... 438/597; 257/692; 257/E23.141; 257/E21.575; 977/784
(58) Field of Classification Search ................ 257/692, 257/E23.141, E21.575; 438/597; 977/784
See application file for complete search history.

(56) References Cited

U.S. PATENT DOCUMENTS

| | | | | |
|---|---|---|---|---|
| 6,887,450 B2 * | 5/2005 | Chen et al. | ............. | 423/445 R |
| 6,891,744 B2 * | 5/2005 | Chen et al. | ................. | 365/151 |
| 6,900,479 B2 * | 5/2005 | DeHon et al. | ............. | 257/202 |
| 6,962,823 B2 * | 11/2005 | Empedocles et al. | .......... | 438/3 |
| 7,064,000 B2 * | 6/2006 | Goldstein et al. | ............. | 438/99 |
| 7,112,525 B1 * | 9/2006 | Bhansali et al. | ............ | 438/618 |
| 2004/0093575 A1 * | 5/2004 | Heath et al. | ................... | 716/8 |

\* cited by examiner

*Primary Examiner*—Asok Kumar Sarkar

(57) ABSTRACT

Embodiments of the present invention are directed to methods for fabricating microscale-to-nanoscale interfaces. In numerous embodiments of the present invention, hybrid microscale/nanoscale crossbar multiplexers/demultiplexers provide for selection and control of individual nanowires through a set of microscale signal lines. In order to overcome the difficulty of aligning nanowires with submicroscale and microscale signal lines, at least a portion of the interconnections between nanowires and sub-microscale or microscale signal lines are randomly generated by one of various connection-fabrication methods. Addresses for individual nanowires, or groups of nanowires, can be discovered by testing the microscale-to-nanoscale interfaces.

29 Claims, 15 Drawing Sheets

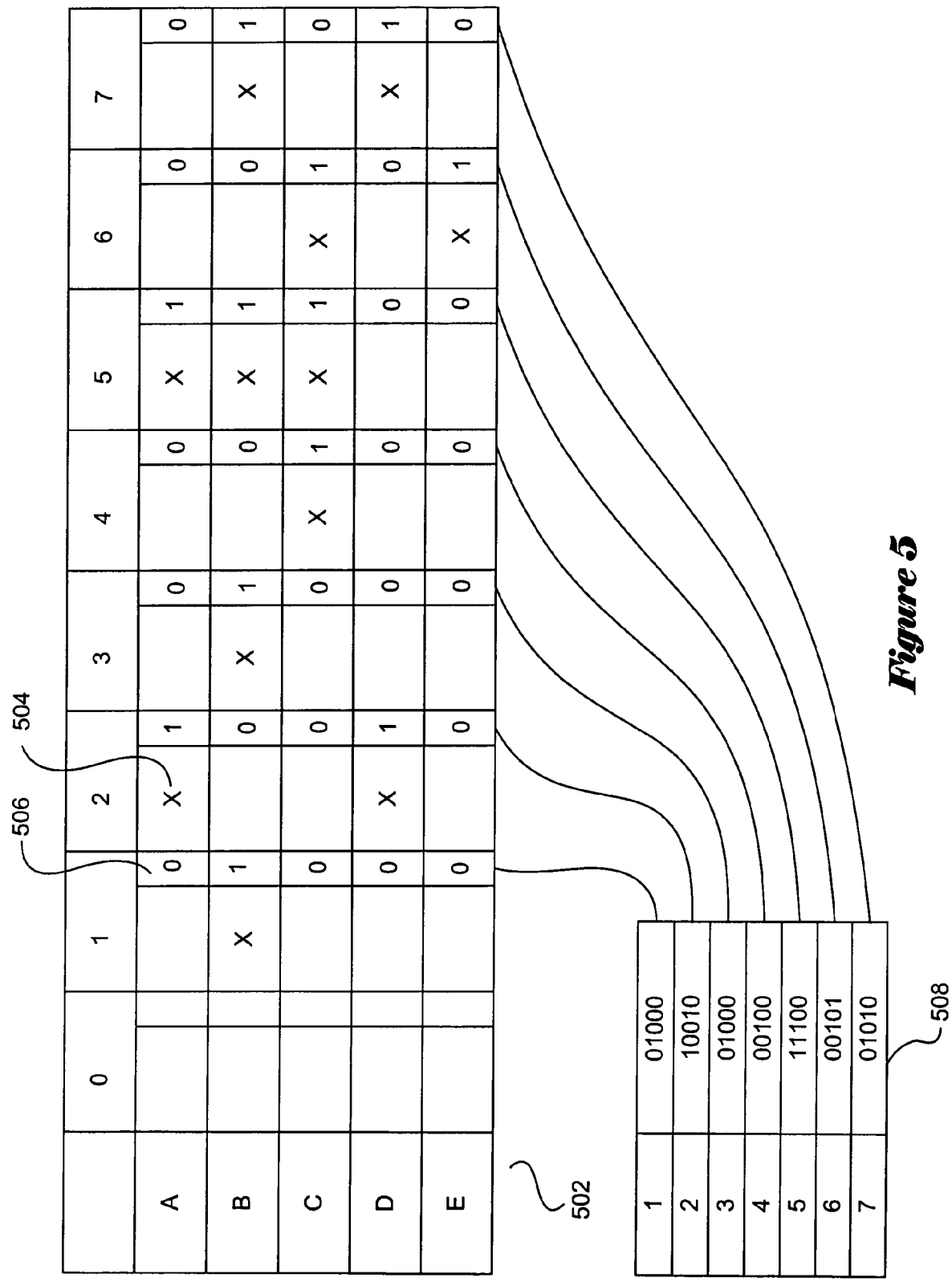

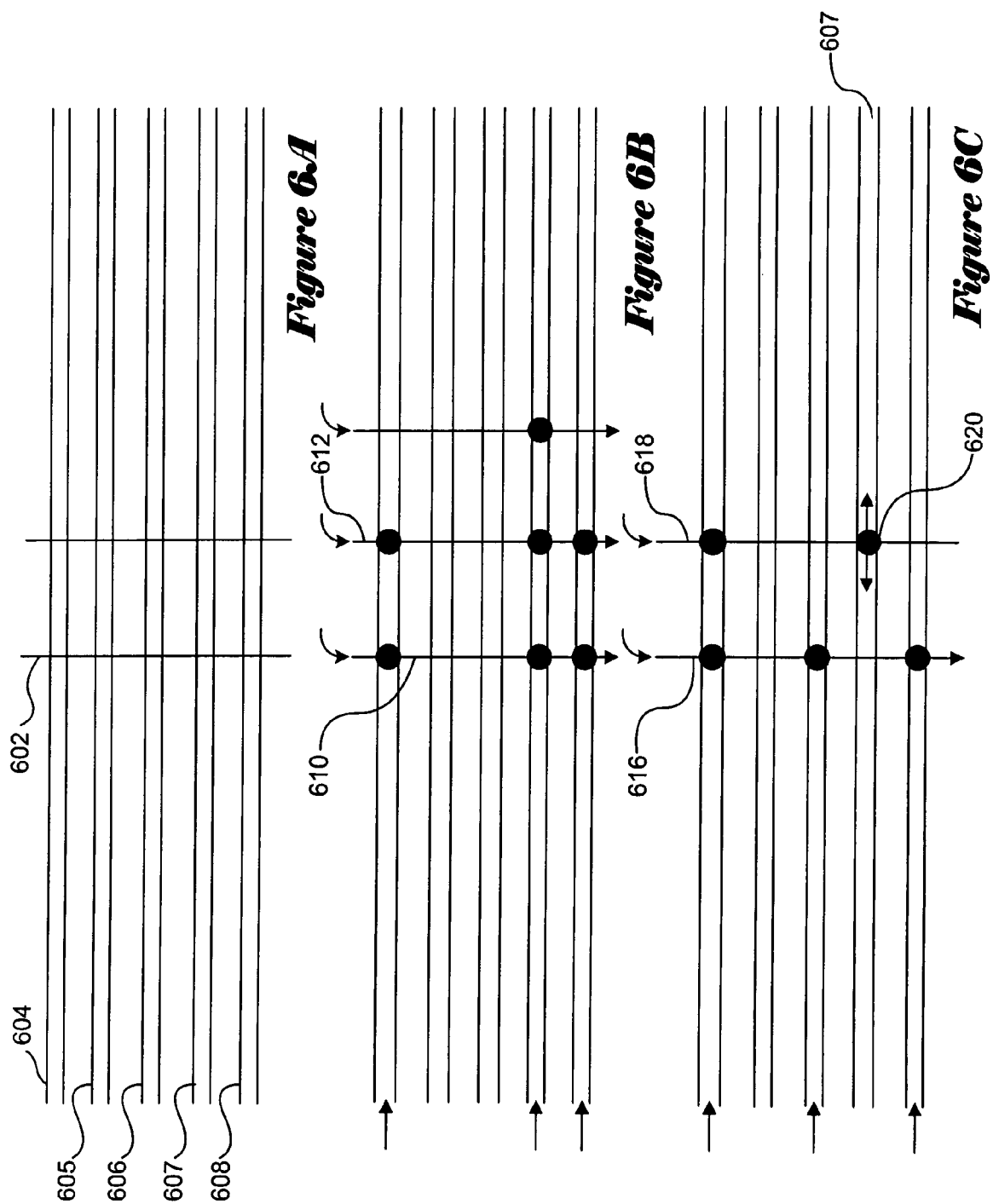

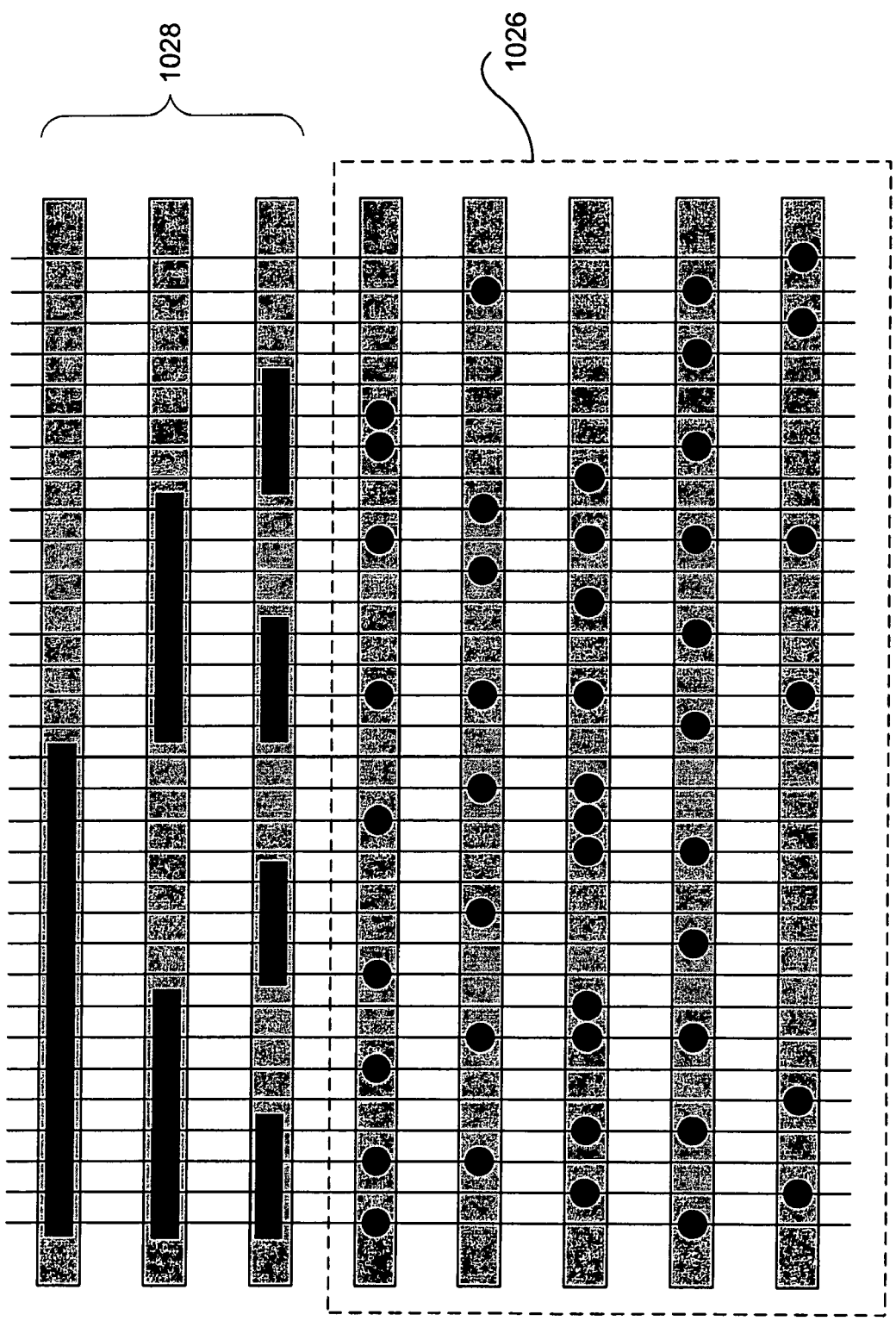

ELECTRONIC DEVICES FABRICATED BY USE OF RANDOM CONNECTIONS

TECHNICAL FIELD

The present invention is related to electronic devices and, in particular, to devices composed of nanoscale components and interfaces between microscale and nanoscale components produced by randomly connecting components.

BACKGROUND OF THE INVENTION

Tremendous progress has been made, during the past 50 years, in continuously decreasing the size of electronic circuits and increasing the density of electronic components within integrated circuits to produce a plethora of high density, high speed, and low cost integrated circuits used in computers, automobiles, personal digital assistants, cell phones, and thousands of other consumer products, machine tools, scientific instruments, communications devices, and other important products. However, it is currently becoming increasingly difficult to continue to decrease the size of transistors, diodes, signal lines, and other components of integrated circuits produced by photolithography-based methods. Not only must new, expensive fabrication facilities for conducting photolithographic methods using shorter-wave-length radiation be constructed, but basic physical limitations in traditional circuit-manufacturing methods and materials are leading to slower development and slower exploitation of next-generation, denser circuitry.

Recently, an alternative to traditional, photolithography-based integrated-circuit design and fabrication has emerged. It is now possible to create nanoscale, molecular-electronic circuits using nanowires and nanowire junctions with controllable electronic properties to produce nanowire-crossbar circuits that can be configured to implement a large variety of logic components and circuits based on logic components. However, nanoscale circuitry needs to be integrated with sub-microscale and microscale circuitry in order to produce useful devices and products that incorporate nanoscale circuitry. Nanowire crossbars can be fabricated by allowing nanowires to self-assemble into layers of parallel nanowires, circumventing the need to painstakingly and precisely position nanowires within nanoscale circuits. Interfacing nanowires to sub-microscale and microscale circuits remains, however, a challenging problem. Individual nanowires need to be aligned with sub-microscale-components and component patterns in order for signals to be input to, and received from, high density nanoscale circuits. Similar alignment problems are also encountered in purely nanoscale devices, including various types of nanowire crossbars. Designers, manufacturers, and users of integrated circuits and electronic devices have recognized the need for cost-effective and reliable methods for interfacing sub-microscale and microscale electronic circuits to nanoscale circuitry and for producing nanowire crossbars, hybrid microscale/nanoscale crossbars, and other devices that include groups of parallel nanowires.

SUMMARY OF THE INVENTION

Embodiments of the present invention are directed to methods for fabricating microscale-to-nanoscale interfaces, nanoscale devices, and hybrid microscale/nanoscale devices and to microscale-to-nanoscale interfaces, nanoscale devices, and hybrid microscale/nanoscale devices fabricated by these methods. In numerous embodiments of the present invention, hybrid microscale/nanoscale-crossbar multiplexers/demultiplexers provide for selection and control of individual nanowires by signals input to a set of microscale signal lines. In order to overcome difficulties attendant with aligning nanowires with respect to submicroscale and microscale signal lines, at least a portion of the interconnections between the nanowires and sub-microscale or microscale signal lines are randomly generated by one of various methods. Addresses for individual nanowires, or groups of nanowires, can be discovered by testing, examining, and/or using the microscale-to-nanoscale interfaces.

BRIEF DESCRIPTION OF THE DRAWINGS

FIG. 5 illustrates determination, according to various embodiments of the present invention, of the addresses of each of the eight nanowires in the random M2N interface ("rM2N interface") shown in FIG. 4D based on the pattern of two-way AND junctions created in the rM2N interface.

FIGS. 6A–C illustrate three different possibilities for addressability of a nanowire within an rM2N interface fabricated, according to various embodiments of the present invention, by randomly interconnecting microscale or sub-microscale signal lines with nanowires.

FIGS. 10A–C illustrate an alternative method for rM2N-interface fabrication, representing one embodiment of the present invention, using a random process for fabrication of only a portion of the interconnections between microscale or sub-microscale signal lines and nanowires.

DETAILED DESCRIPTION OF THE INVENTION

Figure 1:
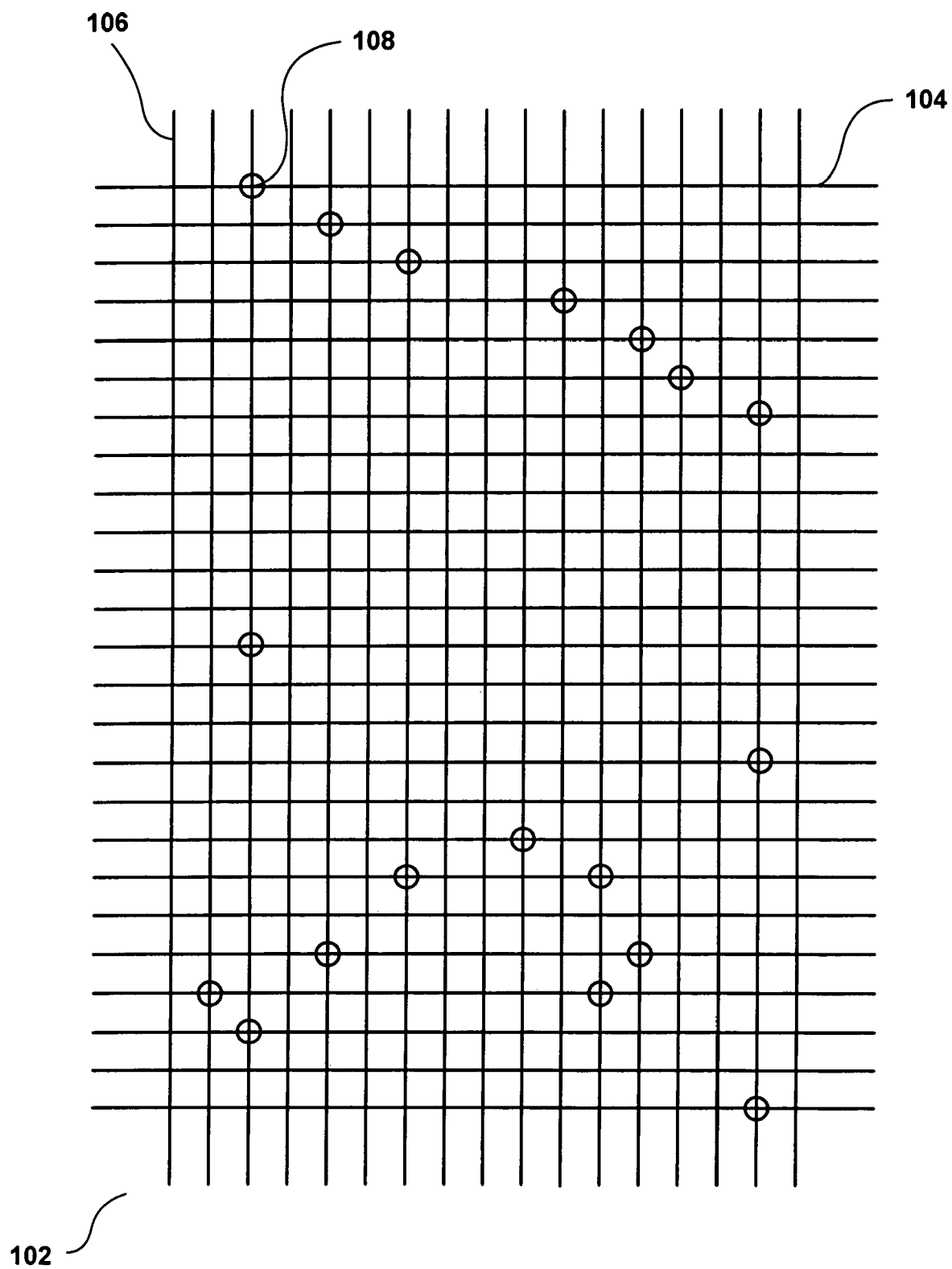
FIG. 1 illustrates a small nanowire crossbar.

Nanoscale circuits are now being manufactured by a variety of techniques. One approach to manufacturing nanoscale circuits is to fabricate grid-like nanoscale crossbars by directed, self-assembly of nanowires. FIG. 1 illustrates a small nanowire crossbar. The nanowire crossbar 102 comprises a first set of parallel, horizontal nanowires, such as horizontal nanowire 104, on top of which a second set of parallel, vertical nanowires, such as vertical nanowire 106, are overlaid. Discrete, programmable interconnections, such as interconnection 108, between horizontal and vertical nanowires can be created by various methods, often applying voltage potentials to particular junctions in order to physically alter the states of molecules at the junctions, such as altering the resistivities of the molecules to current flow. Generally, one or more subsets of nanowires are selected as input signal lines, one or more different subsets of nanowires are selected as output signal lines, and internal junctions are programmed to create a desired mapping between signals input to the signal lines and output on the output signal lines.

As discussed above, interfacing nanowires to sub-microscale and microscale signal lines and other components can be challenging. Generally, microscale and sub-microscale signal lines and components are fabricated using photolithographic methods, the size, structure, and position of each component precisely specified within the tolerances provided by photolithographic methods. By contrast, nanowire crossbars and other nanoscale electronics are generally fabricated by processes involving self-assembly of molecular compounds, atoms, metal clusters, polymers, or other nanoscale or sub-nanoscale particles. Although nanoscale or sub-nanoscale particles can be mechanically positioned using atomic force microscopy, lasers, and other techniques, positioning and interconnection of individual nanowires to etched regions of sub-microscale and microscale electronic components is far too time consuming and expensive to employ for volume manufacture of nanoscale electronic circuits. Instead, microscale-to-nanoscale interface devices and other nanoscale and hybrid microscale/nanoscale devices need to be fabricated economically and quickly, although with sufficient reliability to provide for reasonable yield of working devices.

Figure 2A:
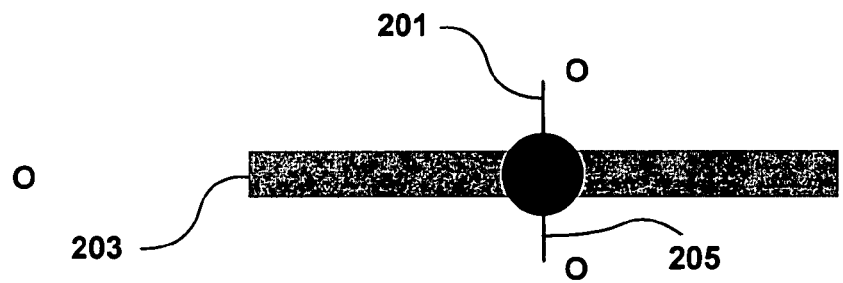
FIGS. 2A–D illustrate operation of a two-way AND junction.
Figure 2B:
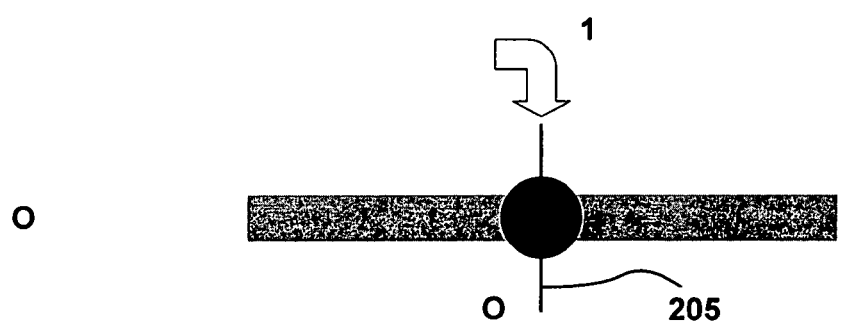
Figure 2C:
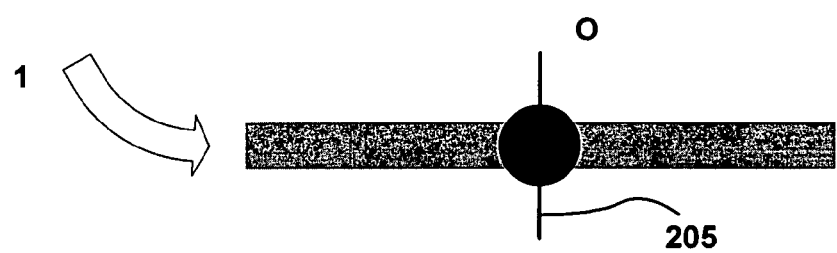
Figure 2D:
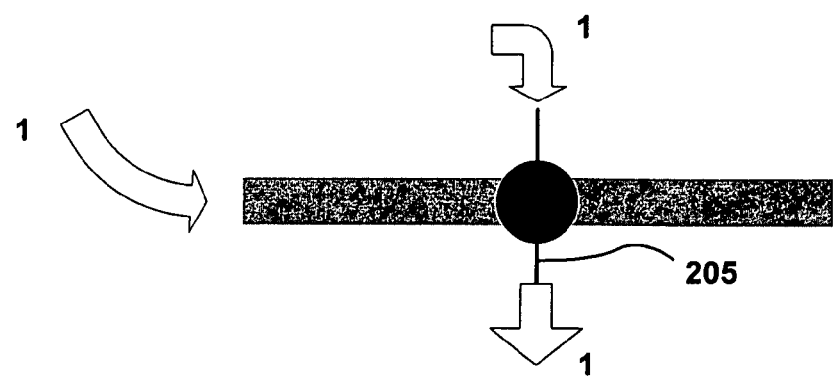

One type of microscale-to-nanoscale interface, described below, uses two-way AND junctions between nanowires and sub-microscale or microscale signal lines. The two-way AND junctions may be fashioned from resistors, diodes, transistors, or other such molecular electronic components. FIGS. 2A–D illustrate operation of a two-way AND junction. Signal lines may either have high or low states, generally represented by binary values "1" and "0." These states may be voltage states, current states, or other electronic states. As shown in FIG. 2A, when inputs to both the nanowire 201 and the microscale signal line 203 are low, the output from the nanowire 205 is low. As shown in FIG. 2B, when input to the nanowire signal line is high, while input to the microscale signal line is low, then output from the nanowire 205 is low. In this case, the low-valued microscale or sub-microscale signal line serves as a sink, or short, for the relatively high voltage or high current signal input to the nanowire. Similarly, as shown in FIG. 2C, when input to the microscale signal line is high, while input to the nanowire is low, then output from the nanowire 205 is also low. Finally, as shown in FIG. 2D, when inputs to both the nanowire and to the microscale signal line are high, then output from the nanowire 205 is also high. The two-way AND junction is thus equivalent to an AND logic gate with two inputs from the microscale signal line and nanowire and one output on the nanowire.

Figure 3:
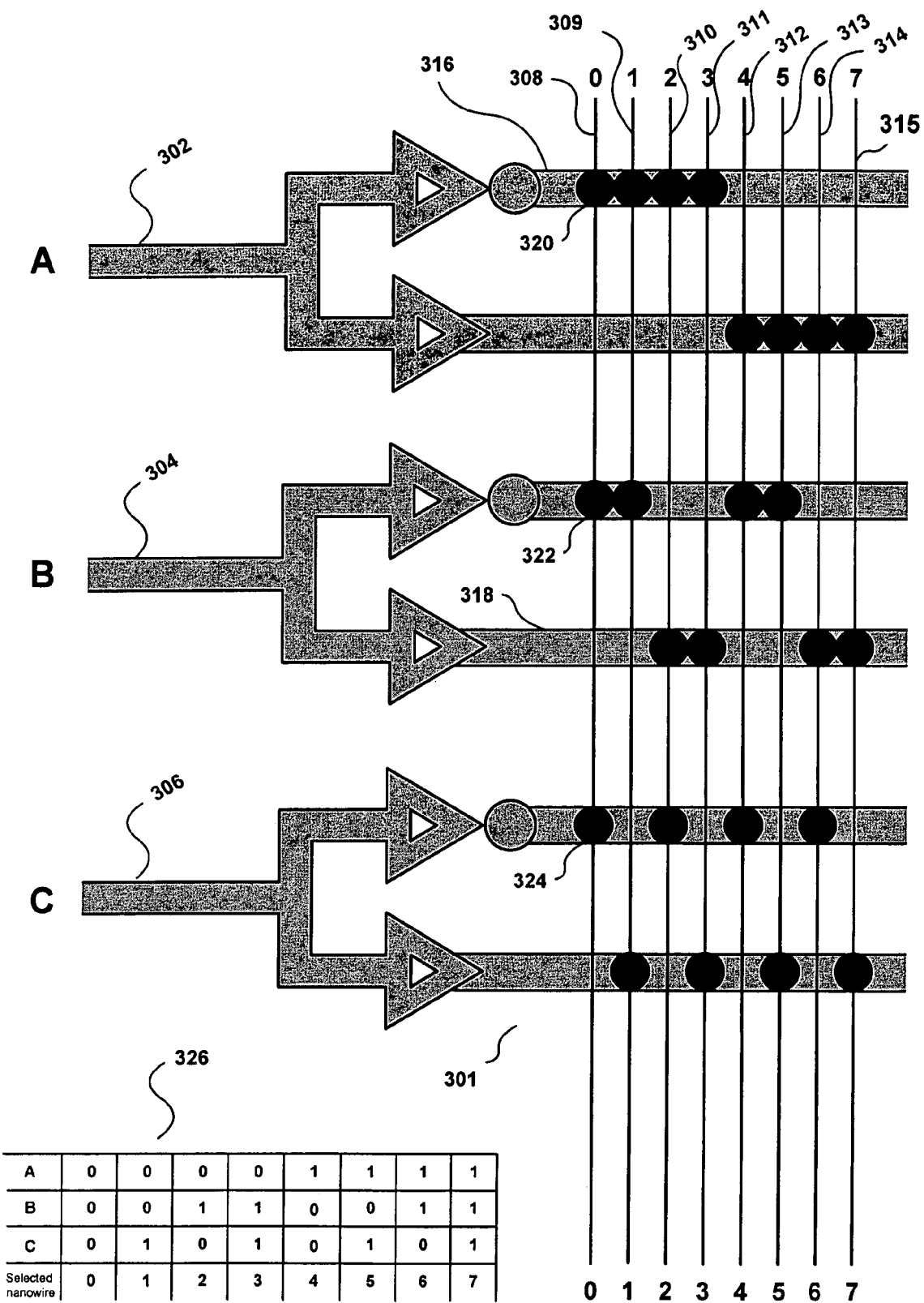
FIG. 3 illustrates a hybrid microscale-to-nanoscale multiplexer interface ("M2N interface").

FIG. 3 illustrates a hybrid microscale-to-nanoscale multiplexer interface ("M2N interface"). The M2N interface 301 includes three microscale input signal lines A 302, B 304, and C 306 and eight nanowires 308–315 referred to as nanowires "0," "1," "2," "3," "4," "5," "6," and "7," respectively. Each horizontal, microscale signal line 302, 304, and 306 is split into a complementary pair of internal signal lines, such as the complementary pair of internal signal lines 316 and 318 branching from signal line A 302. Internal signal line 318 has the same state as input signal line A, while the state of internal signal line 316 is inverted with respect to that of input signal line A. The nanowires 308–315 are selectively interconnected through two-way AND junctions, such as two-way AND junction 320, with the complementary pairs of internal signal lines branching from input signal lines A, B, and C, 302, 304, and 306.

The voltage or current states of the three, microscale input signal lines 302, 304, and 306 represent a three-bit address, and each different possible address uniquely addresses one of the eight nanowires 308–315. A nanowire is addressed when all of the internal microscale signal lines with which the nanowire is interconnected through two-way AND junctions are in a high voltage or high current state. In the M2N interface shown in FIG. 3, for example, nanowire 308 is selected when the internal microscale signal lines interconnected to nanowire 308 through the two-way AND junctions 320, 322, and 324 are in a high current or high voltage state. These three internal signal lines have states complementary to the states of the input signal lines 302, 304, and 306 from which they branch. Thus, when microscale input signal lines 302, 304, and 306 are all low, or have the 3-bit binary address value 000, nanowire 308 is selected. In the selected state, whatever signal is input to nanowire 308 is output from the M2N interface. When a nanowire is not selected, the output from the nanowire is low, regardless of the signal input to the nanowire. FIG. 3 includes a table 326 showing the three-bit addresses for each of the eight nanowires in the M2N interface shown in FIG. 3. It should be noted that, in the most efficient strategies for interconnection of internal microscale signal lines to nanowires, such as the interconnection strategy used for the M2N interface in FIG. 3, each nanowire is interconnected with about half of the internal microscale signal lines. When the number of nanowires N is a power of 2, the number M of microscale input signal lines needed to uniquely address each nanowire is $\log_2 N$.

The M2N interface shown in FIG. 3 allows individual nanowires to be selected by addresses input to microscale signal lines. Thus, individual nanowires can be electronically controlled through this interface. However, fabrication of an M2N interface such as that shown in FIG. 3 is technically challenging. Individual two-way AND junctions need to be fabricated at selected, individual junctions between nanowires and microscale signal lines. There are no currently available fabrication techniques that allow for cost-effective, precise fabrication of two-way AND junctions at individual, predetermined intersections between microscale signal lines and nanowires.

One embodiment of the present invention is a method for fabricating a M2N interface, similar to that shown in FIG. 3, but using randomly fabricated, two-way AND junctions, rather than fabricating two-way AND junctions at predetermined intersections between internal microscale signal lines and nanowires. A random or partially random M2N interface ("rM2N interface") employs a greater number of microscale input signal lines and internal microscale signal lines than needed in an M2N interface, such as that shown in FIG. 3, in order to achieve a relatively high rate of unique addressability of individual nanowires despite the random fabrication of two-way-AND-junction connections. Thus, an rM2N interface is physically distinct from an M2N interface, both in having a greater number of internal and input microscale signal lines than an M2N interface, and in having random or pseudorandom patterns of two-way-AND-junction placement.

Figure 4A:
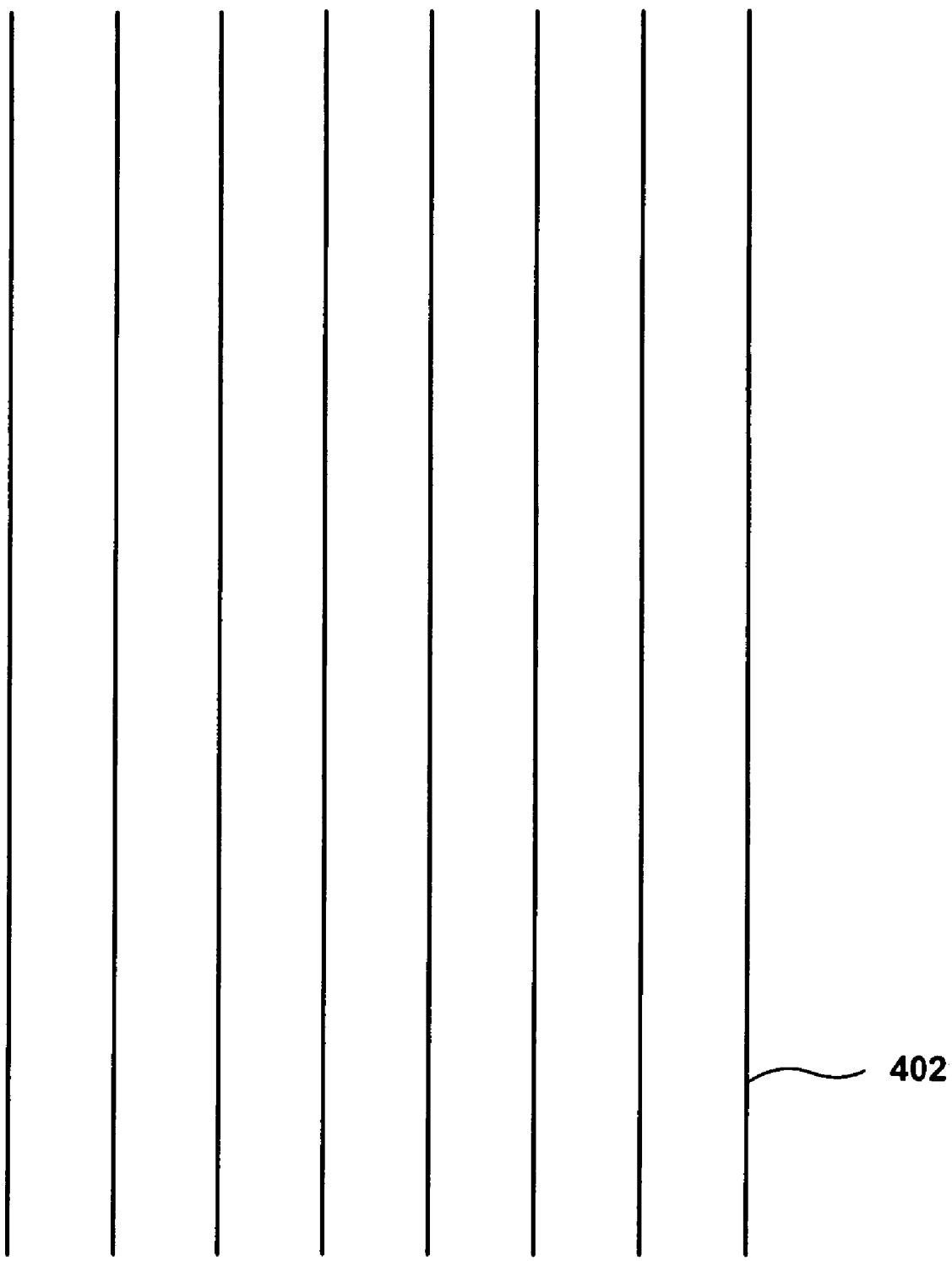
FIGS. 4A–D illustrate one of numerous methods, used in embodiments of the present invention, by which two-way AND junctions can be randomly or pseudo-randomly fabricated within a random or pseudorandom M2M interface.
Figure 4B:
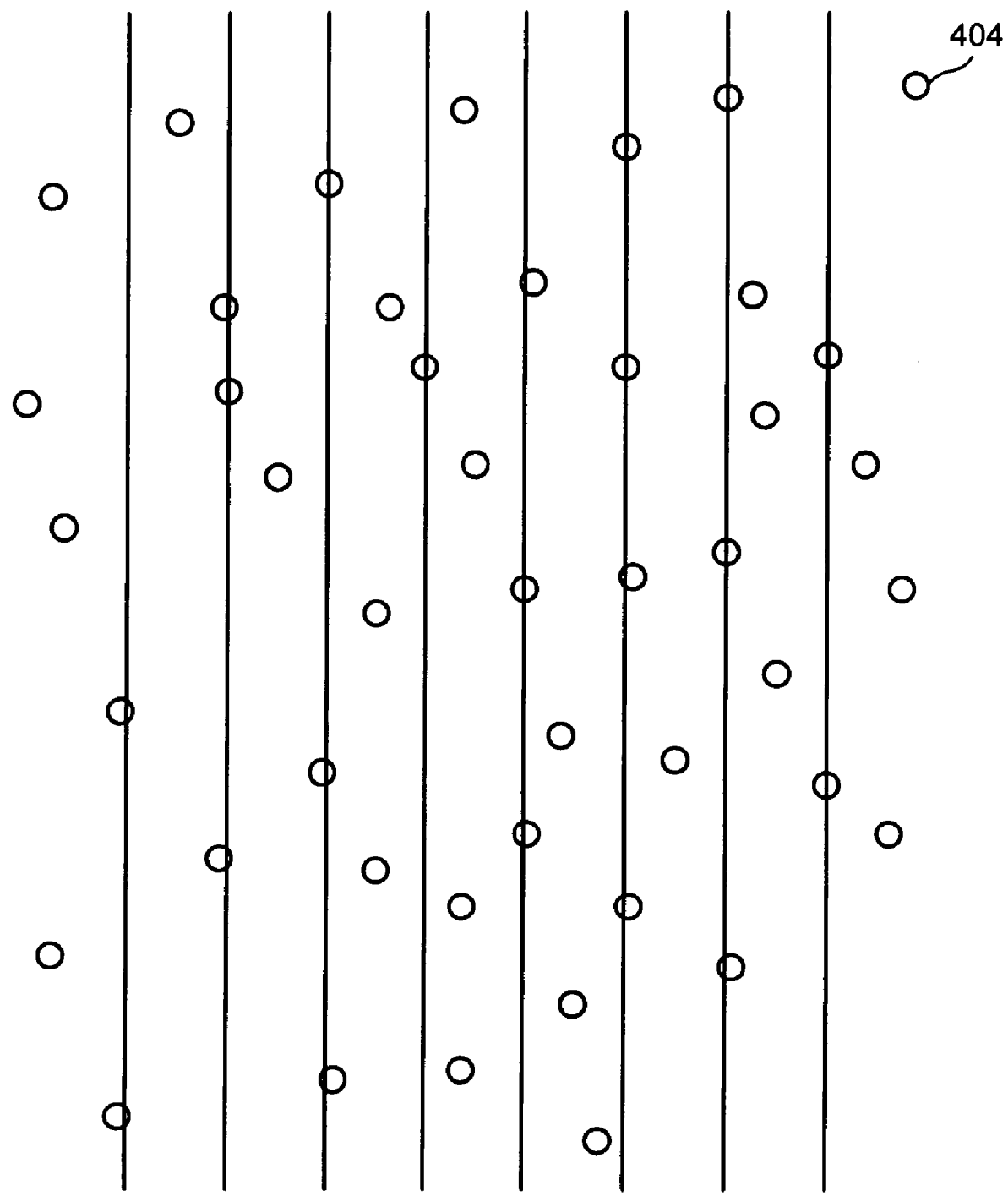
Figure 4C:
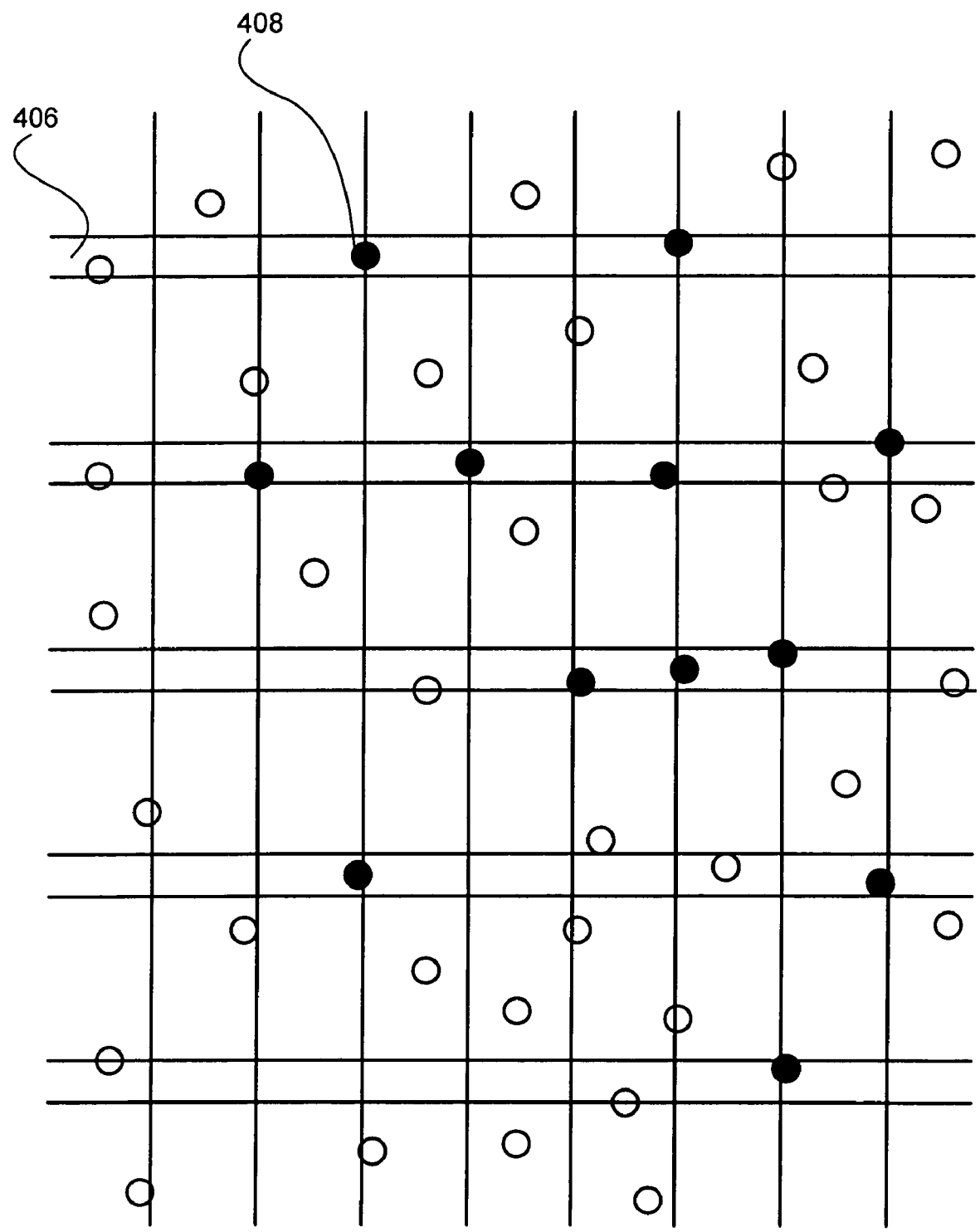
Figure 4D:
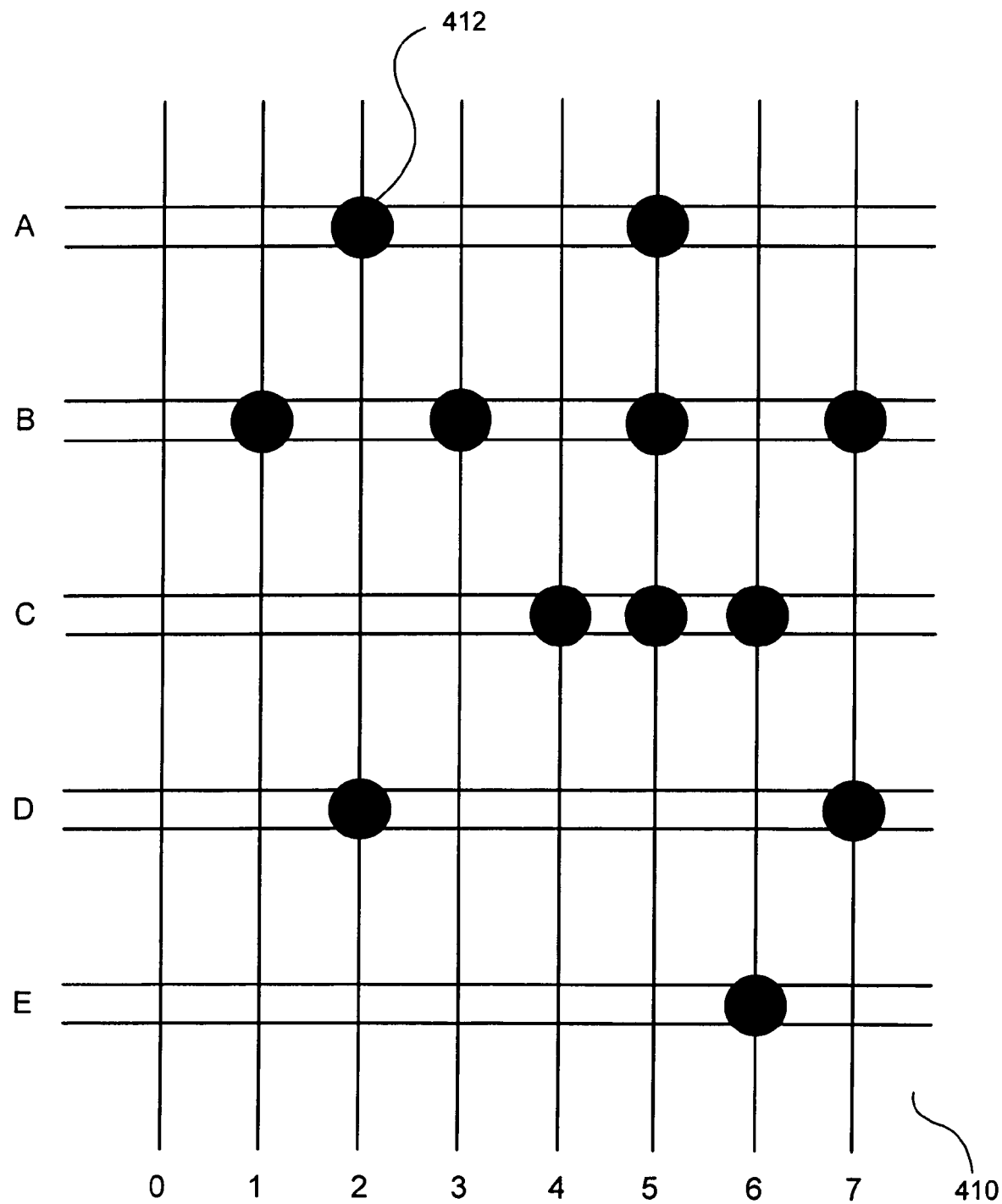

FIGS. 4A–D illustrate one of numerous methods, used in embodiments of the present invention, by which two-way AND junctions can be randomly or pseudo-randomly fabricated within a an rM2M interface. First, a set of parallel nanowires can be fabricated by self-assembly-based methods, as shown in FIG. 4A. Each nanowire is represented in FIG. 4A by a single vertical line, such as vertical line 402. Next, as shown in FIG. 4B, a solution or mixture of conductive or semiconductive nanodots within an insulative liquid or material can be sprayed onto, spread over, or spun onto, the parallel nanowires. The quantum dots, such as quantum dot 404 in FIG. 4B, are therefore more-or-less randomly positioned in a two-dimensional plane including the nanowires. The nanodots may be clusters or complexes of metal or semiconductor atoms or compounds, or other conductive or semiconductive materials. The nanowires may be fabricated from silicon, gold, silicon coated with silicon dioxide, or organic polymers, among other materials. Next, as shown in FIG. 4C, a set of parallel, internal microscale or submicroscale signal lines, such as microscale signal line 406, can be layered over, or fabricated on top of, the first layer of nanodot-coated, parallel nanowires. When a nanodot ends up in the overlap region between an internal microscale signal line and a nanowire, as in the case of nanodot 408 in FIG. 4C, the internal microscale signal line and nanowire end up interconnected through a two-way AND junction. Nanodots in contact with only a nanowire, with only an internal microscale signal line, or with neither a nanowire nor an internal microscale signal line do not form two-way AND junctions. Thus, as shown in FIG. 4D, the final, hybrid microscale/nanoscale crossbar 410 includes randomly positioned, two-way AND junctions interconnecting the internal microscale signal lines and nanowires.

In alternative embodiments, the internal microscale signal lines may be first fabricated, and then overlaid with nanodots and nanowires. Random fabrication of two-way AND junctions in an rM2M interface can be obtained by a variety of alternative methods. In one alternative method, nanodots are randomly attached to nanowires, which then self-assemble into a set of parallel, nanowires for interfacing to a set of parallel, roughly orthogonal, internal, microscale address signal lines. In yet another embodiment, block copolymers with alternating conductive and insulative regions may self-assemble to create random interconnections between nanowires and internal microscale signal lines. In yet another embodiment, an imprinting mask can be fashioned to have random pillars, and can be used to introduce random holes within a layer of insulative polymer. Metal deposited into the holes can then form a random array of conductive dots that remain following removal of the imprinting mask.

Having fabricated the rM2N interface, shown in FIG. 4D, the interface can be tested or examined in order to determine addresses for each nanowire. For example, all possible five-bit addresses can be input to the microscale input signal lines A–E, and a determination made, for each input address, which of the nanowires are selected. Alternatively, each junction within the rM2N interface may be separately tested to determine whether or not a two-way AND junction has been created at the junction. FIG. 5 illustrates determination of the addresses of each of the eight nanowires in the rM2N interface shown in FIG. 4D based on the pattern of two-way AND junctions created in the rM2N interface. First, a table 502 is made in which each nanowire is represented by a vertical column, and each microscale input signal line is represented by a row. Each cell in the table therefore represents a possible interconnection between a microscale input signal line and a nanowire. Each two-way AND junction, such as two-way AND junction 412 in FIG. 4D, is represented by a symbol "X" in a cell in the table 502, such as the symbol "X" 504 representing two-way AND junction 412 in FIG. 4D. Next, five-bit binary addresses are constructed for each nanowire as vertical columns of binary digits within the column associated with the nanowire, such as the vertical column of binary digits 506 in FIG. 5 associated with nanowire "1." A symbol "X" in a cell is reflected as a binary value "1" for the binary digit of the nanowire address corresponding to the binary digit, and lack of a symbol "X" in a cell is reflected as a binary value "0" for the binary digit of the nanowire address corresponding to the binary digit. In other words, the binary value "1" in a five-bit binary address indicates that there is a two-way AND junction interconnecting the internal microscale signal line associated with the microscale input signal line at the position of the binary digit "1" within the five-bit binary address and the nanowire associated with the five-bit binary address. In FIG. 5, the highest order binary digit in a five-bit binary address corresponds to microscale input signal line A, and the lowest order binary digit in a five-bit binary address corresponds to microscale input signal line E. The constructed five-bit binary addresses can be accumulated in a table 508 listing the binary addresses associated with each nanowire.

There are four different possibilities, with respect to addressability in an rM2N interface, for any particular nanowire. FIGS. 6A–C illustrate three different possibilities for addressability of a nanowire within an rM2N interface fabricated by randomly interconnecting internal microscale or sub-microscale signal lines with nanowires. In FIGS. 6A–C, a single internal microscale signal line is shown for each microscale input signal line, rather than a complementary pair of internal microscale signal lines. Two-way AND junctions are shown between nanowires and the internal microscale signal lines that each correspond to a single microscale input signal line. In the implementation shown in FIG. 3, the two-way AND junctions would interconnect a nanowire with one of two complementary internal microscale signal lines branching from a single microscale input signal line. The representation chosen in FIGS. 6A–C, and in later figures, can either represent an implementation where complementary pairs are not branched from each input signal line, or an implementation where complementary internal signal lines branch from each input signal, with the understanding that, in the latter case, the present of a two-way AND junction between an internal signal line and a nanowire means that the nanowire is interconnected with the non-inverted internal signal line of a complementary pair, while the absence of a two-way AND junction between an internal signal line and a nanowire means that the nanowire is interconnected with the inverted internal signal line of a complementary pair.

First, as shown in FIG. 6A, there may be no two-way AND junctions interconnecting a particular nanowire 602 with any of the microscale signal lines 604–608. In such cases, the nanowire is not addressable, and is essentially orphaned by the interface. In a second case, shown in FIG. 6B, a particular nanowire 610 may not be uniquely addressable. Other nanowires may have identical patterns of interconnection with microscale signal lines, such as nanowire 612 in FIG. 6B, or may have a subset of the interconnections, such as nanowire 614 in FIG. 6B. When the address for nanowire 610 is input to the horizontal microscale signal lines, with a high signal on each microscale signal line for which there is a two-way AND junction with nanowire 610, nanowires 612 and 614 are also selected. In this case, a signal input to each of the nanowires 610, 612, and 614, either high or low, is output by the interface. In a third, generally desirable case, a nanowire is uniquely addressable. For example, as shown in FIG. 6C, nanowire 616 is uniquely addressable with respect to nanowire 618. When the pattern of high and low signals are input to the horizontal, microscale signal lines to address, or select, nanowire 616, nanowire 618 is not selected. The two-way AND junction 620 essentially shorts any signal input to nanowire 618 to the horizontal, microscale signal line 607, which is in a low voltage or low current state during input of the signal that addresses nanowire 616 to the microscale signal lines. Similarly, when nanowire 618 is addressed, nanowire 616 is not selected. In a fourth possibility for connectivity, both internal, complementary microscale signal lines associated with all of the microscale input signal lines may end up being connected to a nanowire, and the nanowire is thus always selected, regardless of the input address, or both internal, complementary microscale signal lines associated with one or several microscale input signal lines may end up being connected to a nanowire, effectively associating the nanowire with multiple different addresses. Thus, a nanowire may not be uniquely addressable due to being selected by more than one address, or by all addresses.

In most applications, it is desirable for all N nanowires in an rM2N interface to be uniquely addressable, although, due to random placement of two-way AND junctions, unique addressability of all N nanowires cannot be guaranteed. By increasing the number of microscale input signal lines, a greater probability of unique addressability of all N nanowires can be achieved. The increased number of microscale input signal lines essentially compensates for the nanowires that are either orphaned or that are not uniquely addressable, as discussed above with reference to FIGS. 6A–B. In a non-randomly fabricated M2N interface, $M=\log_2 N$. For an rM2N interface, $M>\log_2 N$.

The binary address $a_i$ for a nanowire i can be mathematically represented as:

$$a_i = (n_{1,i}, n_{2,i}, \ldots, n_{M,i})$$

where $n_{k,i}$ is the bit value associated with the potential interconnection between nanowire i and the $k^{th}$ microscale input signal line; and M is the number of microscale input signal lines.

A nanowire i is not addressable when:

$$a_i = (0, 0, \ldots, 0)$$

This corresponds to the case discussed above with reference to FIG. 6A. A nanowire i is not uniquely addressable in the case that:

$$\exists j \therefore a_i a_j \neq I a_j$$

where I is the identity vector $(1, 1, \ldots, 1)$; and represents component-wise multiplication of two vectors. This corresponds to the case discussed above with reference to FIG. 6B. As discussed with reference to FIG. 6C, a nanowire is uniquely addressable when:

$$\forall j \neq i, a_i a_j \neq I a_j$$

Because interconnections within an rM2N interface are fabricated by a random or approximately random procedure, the pattern of interconnections between microscale signal lines and nanowires cannot be predicted, but must instead be discovered by testing or examination, as discussed above. However, the ratio of microscale input signal lines to nanowires can be controlled, because the number of microscale input signal lines is a controllable design and manufacturing parameter, and the number of nanowires can be approximately determined by controlling, or directing, the self-assembly process by which nanowires are fabricated. The probability of interconnection between an arbitrary microscale input signal line and an arbitrary nanowire can also be controlled. For example, in the fabrication method discussed above, with reference to FIGS. 4A–D, the probability of interconnection at each junction within the rM2N interface is directly related to the density of nanodots in the solution or mixture of nanodots sprayed onto, spread over, or spun onto, the nanowires.

Figure 7:
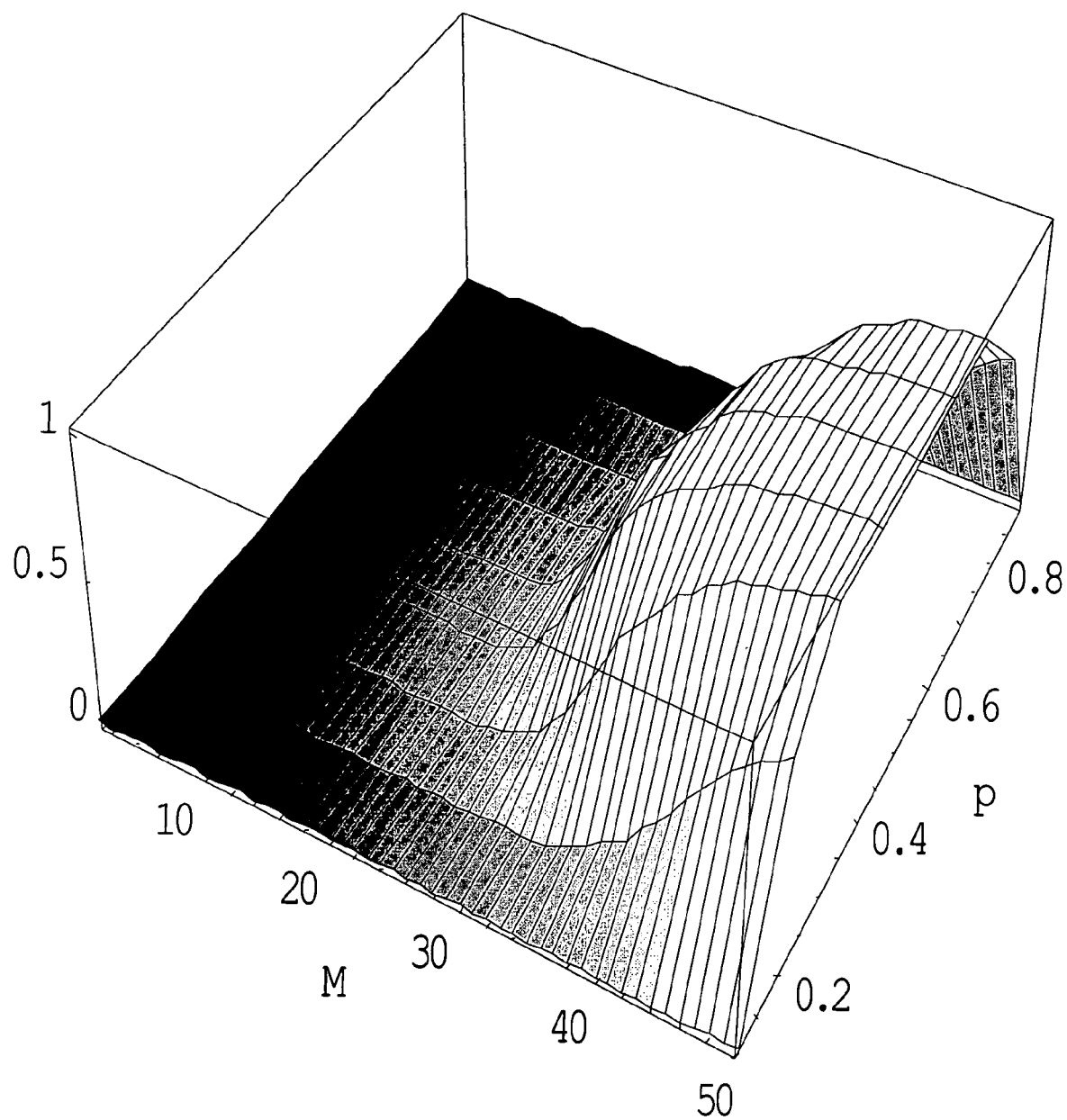
FIG. 7 shows a three-dimensional graph illustrating the relationship between the probability of unique addressability of all 64 nanowires in an rM2N interface as the number of microscale signal lines and the probability of interconnection are varied.

The probability of unique addressability of all of the nanowires in a particular rM2N interface is related both to the ratio of microscale signal lines to nanowires and to the probability of interconnection at any given microscale-signal-line/nanowire intersection. FIG. 7 shows a three-dimensional graph illustrating the relationship between the probability of unique addressability of all 64 nanowires in an rM2N interface as the number of microscale signal lines and the probability of interconnection are varied. In FIG. 7, the vertical, or z, axis 702 represents probabilities of unique addressability of all 64 nanowires, the x axis 704 represents numbers of microscale address signal lines, and they axis 706 represents probabilities of interconnection between a given nanowire and a given microscale signal line. As can be readily observed in FIG. 7, there is a threshold level 708 at the base of a prominent peak 710, interior to which the probability for unique addressability of all 64 nanowires steeply rises to a relatively broad plateau. The threshold is a function both of the probability of interconnection, represented by the y axis, and the number of microscale input signal lines, represented by the x axis. The number of microscale input signal lines at the threshold is lowest when the probability of interconnection is 0.5. Therefore, for many purposes, a most efficient hybrid microscale/nanoscale-crossbar interface fabrication method is one in which the probability for interconnection between an arbitrary nanowire and an arbitrary microscale signal line is near 0.5.

Figure 8:
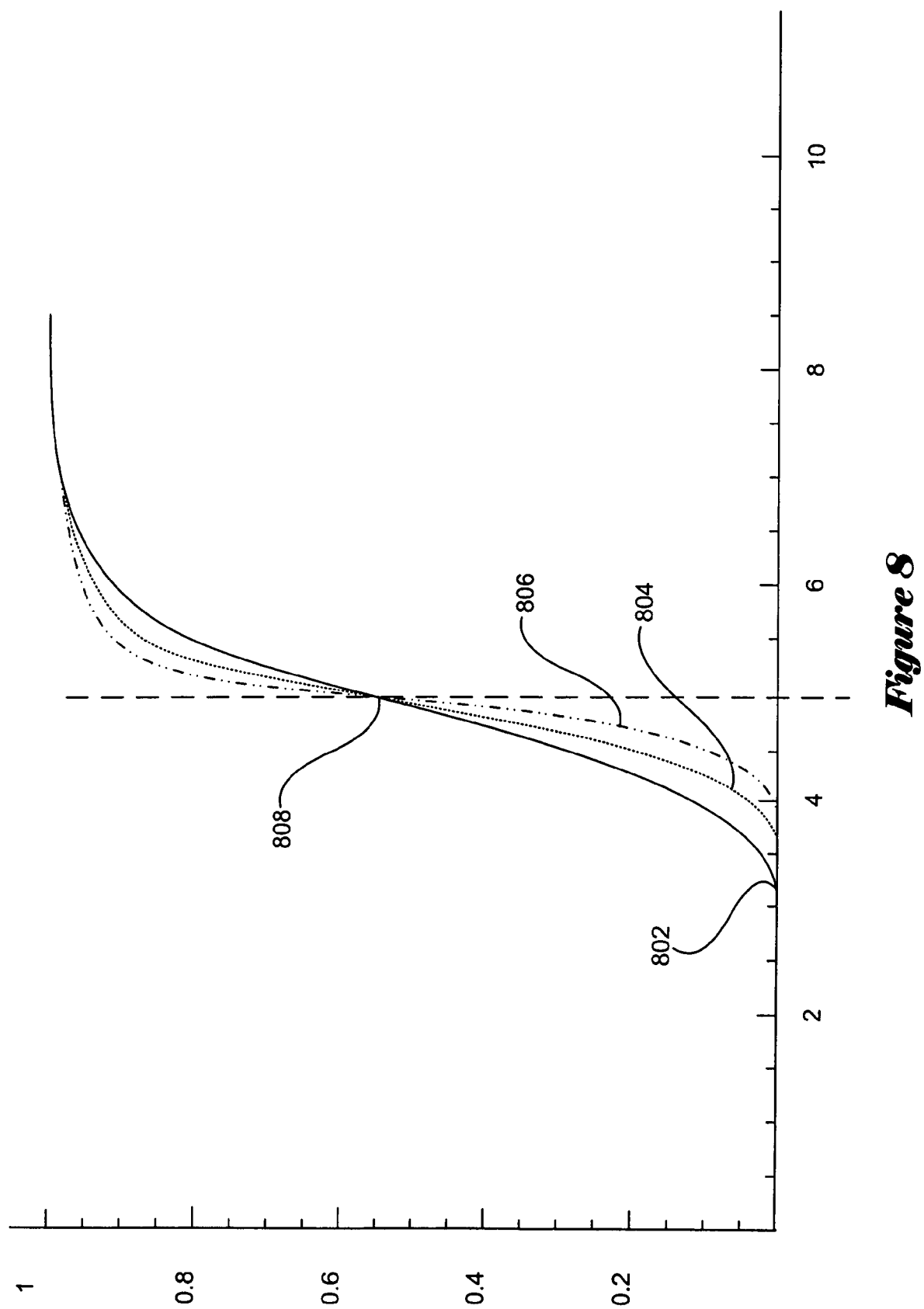
FIG. 8 shows three curves representing the probability that all of the N signal lines in an rM2N interface are uniquely addressable versus $M/\log_2(N)$, where M is the number of microscale signal lines.

FIG. 8 shows three curves representing the probability that all of the N signal lines in an rM2N interface are uniquely addressable as a function of $M/\log_2(N)$, where M is the number of microscale signal lines. The first curve 802 is for an rM2N interface with N=16, the second curve 804 is for an rM2N interface with N=32, and the final curve 806 is for an rM2N interface with M=64. As can be seen in FIG. 8, all three curves intersect at a single point 808 with an x-axis value of "5." Taking this point as the threshold point, it can then be seen that the threshold value for the number of microscale input signal lines M needed to achieve an above-threshold probability for unique addressability of all N signal lines is given by the expression:

$$M = 5\log_2 N$$

Thus, the number of microscale input signal lines M needed in an rM2N interface in order to achieve a threshold probability of unique addressability of all N nanowires is proportional to $\log_2 N$. The number of microscale input signal lines M needed for a reasonably high probability of unique addressability thus scales well with an increase in the number of nanowires that need to be addressed, i.e., the number grows only logarithmically with the number of nanowires, the same as for the ideal connections of the M2N interface.

Figure 9:
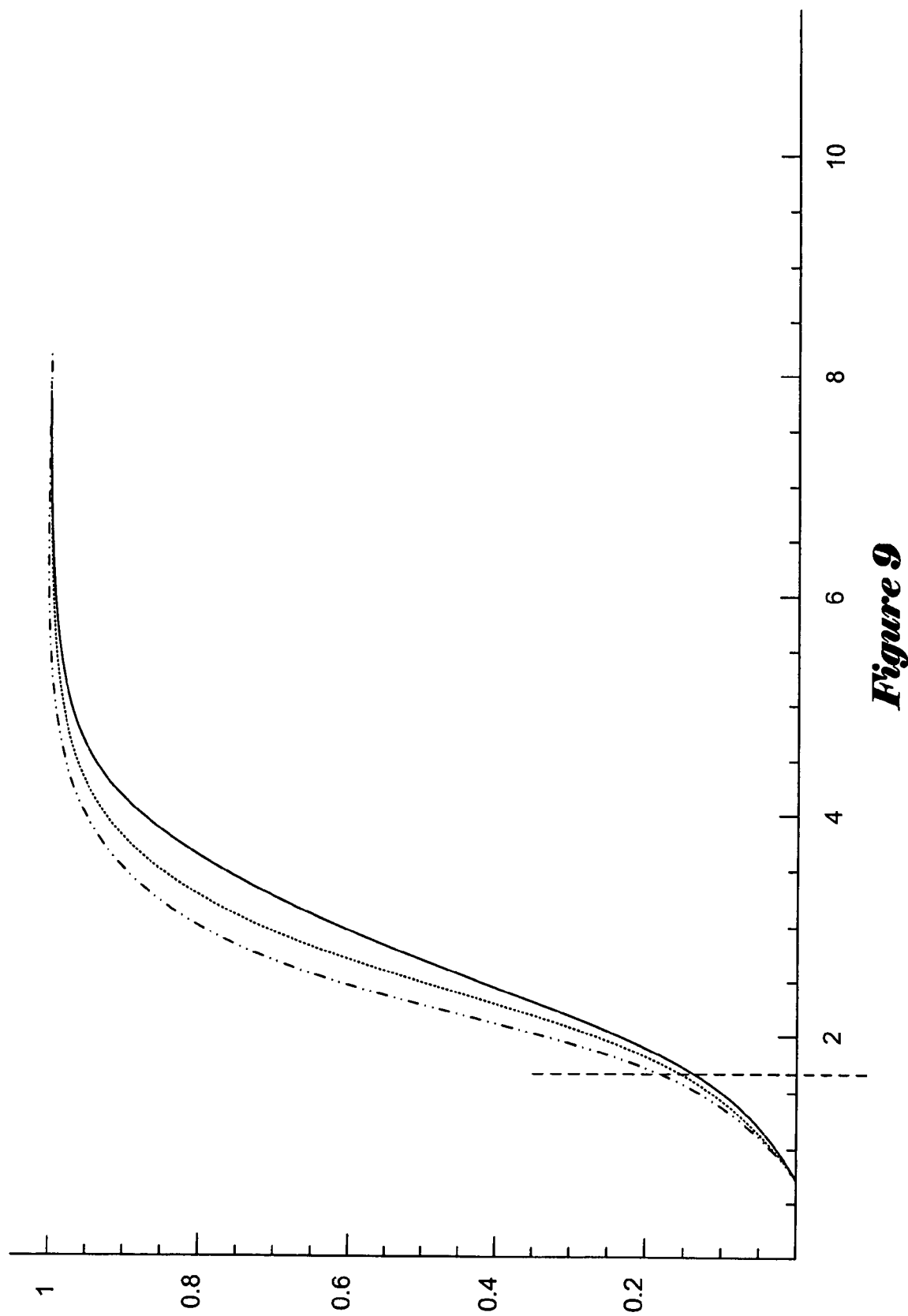
FIG. 9 shows curves similar to those shown in FIG. 8, but for the probability of unique addressability of 80% of the nanowires versus $M/\log_2(N)$.

FIG. 9 shows curves similar to those shown in FIG. 8, but for the probability of unique addressability of 80% of the nanowires versus $M/\log_2(N)$. In this case, the threshold number of microscale input signal lines M needed to ensure a reasonably high probability that 80 percent of the nanowires are uniquely addressable is significantly lower than the threshold value of M needed to ensure a reasonably high probability that all of the nanowires are uniquely addressable. It may therefore be economically optimal to employ a number of microscale input signal lines needed to ensure an above-threshold probability of unique addressability of less than 100% of the nanowires during manufacture, since the cost of manufacture is proportional to the number of microscale input signal lines. Additional nanowires may be included, and the fabricated rM2N interfaces tested to determine those nanowires that are addressable and useable. Alternatively, rM2N interfaces with less than 100% unique addressability of nanowires may be considered defective, resulting in a decrease in the over-all yield of the manufacturing process. Depending on the relative costs of adding microscale input signal lines and decreasing the yield of the manufacturing process, an optimal number of microscale input signal lines for a particular type of rM2M array may be determined to be less than that needed to provide a high probability of unique addressability of all N nanowires.

It may also be possible to control the variation in the number of interconnections per nanowire in an rM2N. The threshold number of microscale input signal lines M needed to provide a high probability of unique addressability of an arbitrary percentage of the N nanowires in an rM2N interface is significantly less when each nanowire has the same number of interconnections than when the number of interconnections per nanowire is probabilistically distributed. Therefore, a third, controllable manufacturing parameter is the probability that each nanowire is interconnected with M/2 microscale input signal lines and the variance in interconnections per nanowire created by the random interconnection fabrication process. In one embodiment, electrostatic repulsion between charged nanodots in a nanodot solution provides a means by which the density of nanodots in the plane of a parallel set of nanowires of microscale signal lines can be controlled, in turn controlling the variance in the number of interconnections between nanowires and microscale signal lines, and, together with the concentration of nanodots in the solution or mixture to which nanowires are exposed, provides a means for controlling the number of interconnections per nanowire.

In an rM2N interface, unique addressability for nanowires may be an important, but less than full goal. It may be that junctions are not completely binary in nature, but that some current or voltage passes through the nanowire despite a junction being in the "0," or OFF state. In such cases, noise may be introduced into the output signals that depends on the relative numbers of ON and OFF junctions between a selected nanowire and non-selected nanowires. Thus, not only must nanowires be uniquely addressable, the need also to have distinguishable outputs, when selected, from non-selected nanowires in the presence of noise. Adding additional microscale input signal lines can, as with the unique addressability problem, increase the distinguishability of nanowire outputs in the presence of noise. Although the constant K in the expression $M=K \log_2 N$ for the number of input signal lines needed to provide unique addressability and adequate distinguishability increases with increasing noise levels, or with increased need for differentiability between selected and non-selected nanowire signals, the relationship remains logarithmic, and thus the microscale/nanoscale interface scales well with increasing numbers of nanowires.

Figure 10A:
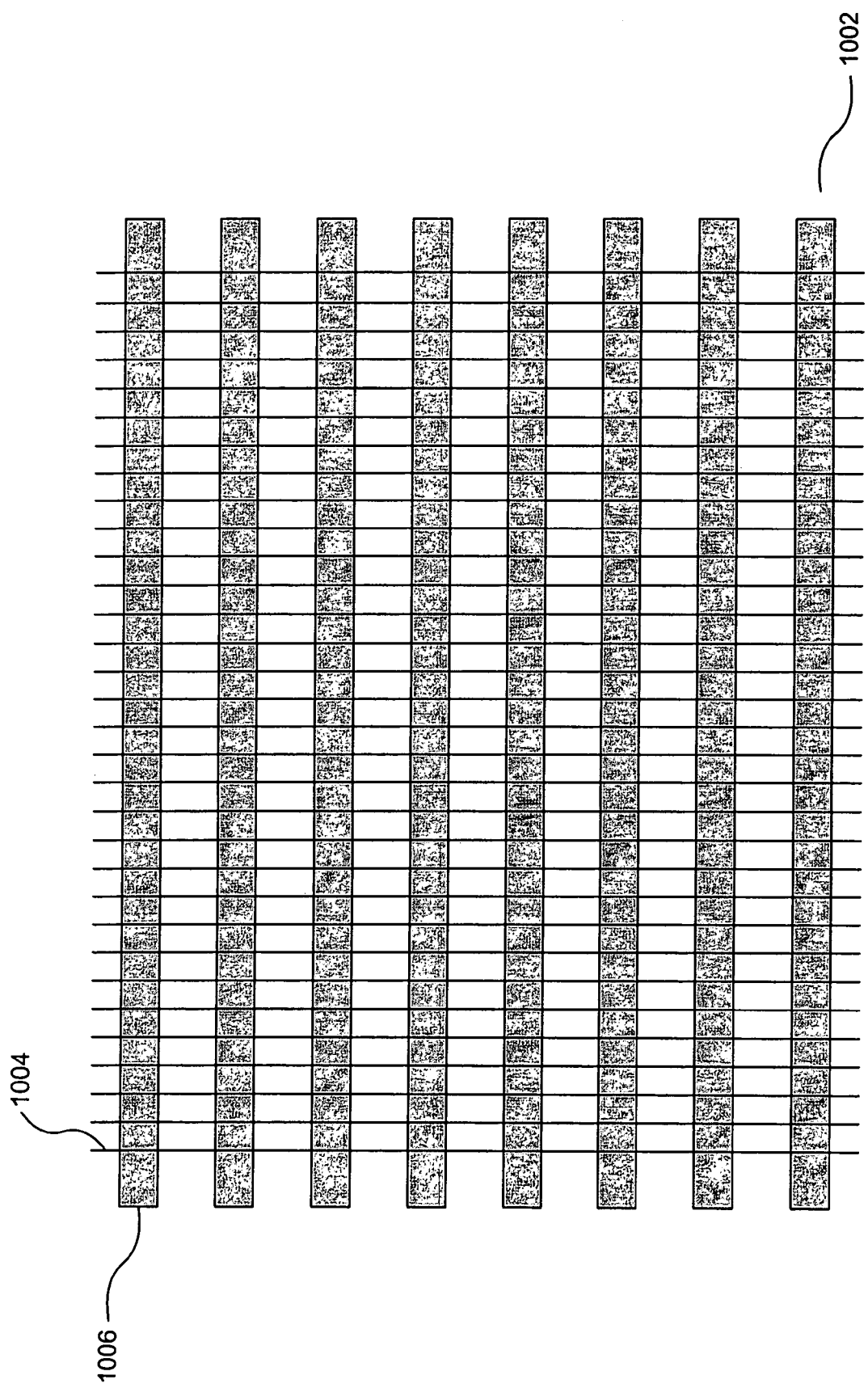
Figure 10B:
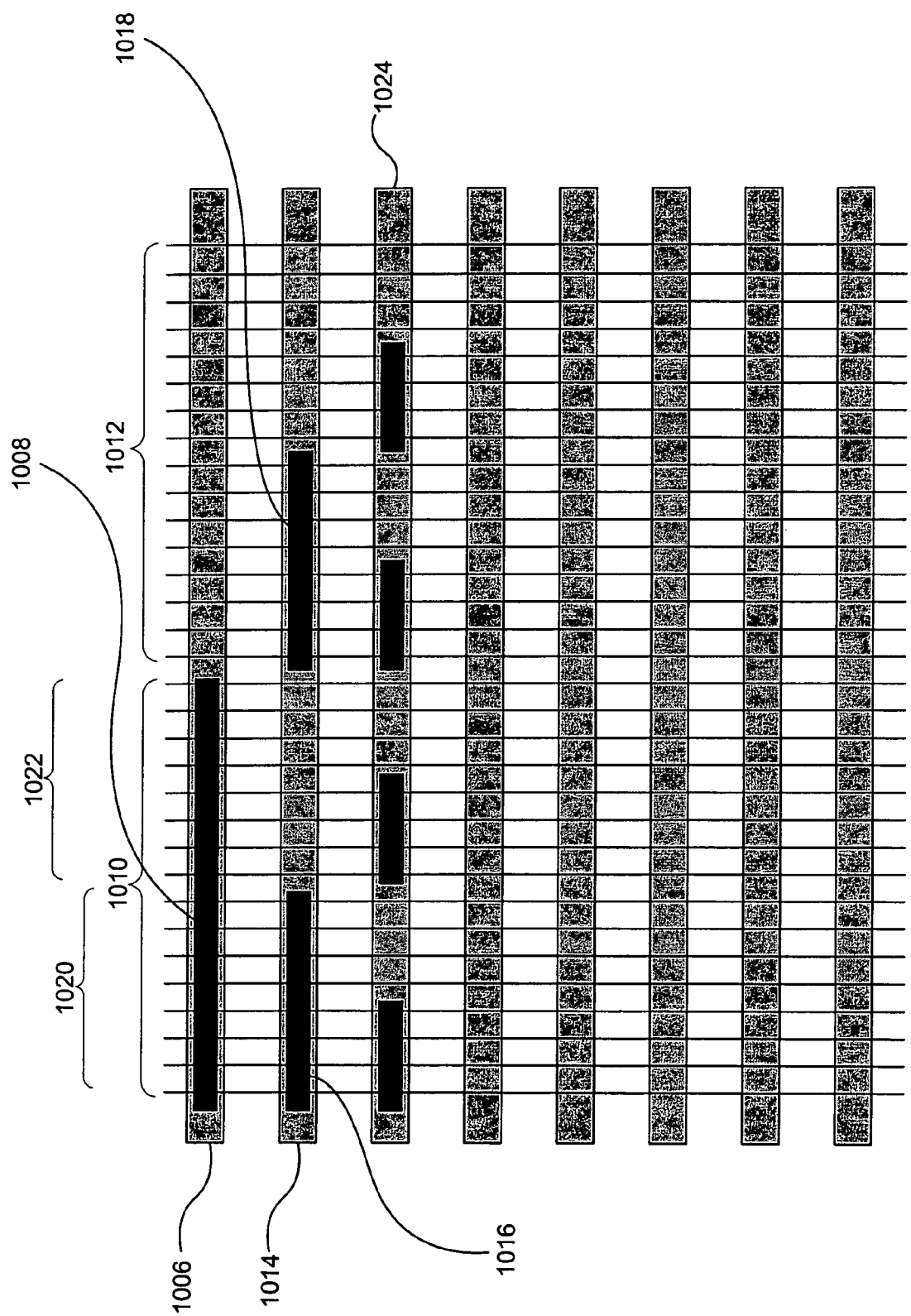

In an alternate embodiment of the present invention, a portion of the microscale-signal-line-to-nanowire interconnections are specifically manufactured by traditional photolithography-based methods, while a portion of the microscale-signal-line-to-nanowire interconnections are fabricated by a random process. In the second alternative embodiment, the number of additional microscale input signal lines needed to compensate for employing random interconnection-fabrication methods is decreased, without adding an overriding or offsetting cost to the overall manufacturing process. FIGS. 10A–C illustrate an alternative method for rM2N-interface fabrication using a random process for fabrication of only a portion of the interconnections between microscale or sub-microscale signal lines and nanowires. FIG. 10A shows an M2N interface 1002 with 32 nanowires, such as nanowire 1004, and eight microscale signal lines, such as microscale signal line 1006. Note that, like in FIGS. 6A–C, complementary pairs are not shown in FIGS. 10A–C. As shown in FIG. 10B, the interconnections corresponding to the high-address bits of the binary addresses of the nanowires can be fabricated in blocks, by traditional photolithography-based methods. This is possible because the blocks have microscale or sub-microscale dimensions obtainable by traditional manufacturing processes. For example, as shown in FIG. 10B, the block 1008 interconnection between the first 16 nanowires 1010 and the first microscale signal line 1006 specifies a binary value "1" for the high-order bits of the binary addresses for the first 16 nanowires 1010 and specifies a binary value "0" for the high-order bits of the binary addresses for the second group of 16 nanowires 1012. For the second microscale signal line 1014, interconnection blocks spanning eight nanowires 1016 and 1018 are separated from one another by sections of eight unconnected nanowires. The first two, highest order bits of the addresses of the first eight nanowires 1020 have the binary values "11," while the first two, highest-order bits of the binary addresses of the second group of eight nanowires 1022 have the binary values "10." In similar fashion, the next microscale address signal line 1024 is patterned with block interconnections spanning four nanowires, separated from one another by four-nanowire blocks of unconnected nanowires. As the size of the interconnection blocks decreases with each next-considered microscale signal line, a level is reached at which smaller interconnection blocks cannot be fabricated by traditional methods. At that point, as shown in FIG. 10C, random fabrication of interconnections within the remaining block 1026 of microscale signal lines is employed. Because the first set 1028 of microscale signal lines have the connection blocks exactly manufactured in patterns to ensure unique, high-order-bit-address portions for each nanowire, the number $M_1$ of microscale signal lines in the first set of microscale, address fully specifies the first $M_1$ bits in each nanowire address. The number $M_2$ of microscale input signal lines needed in area across which interconnections are randomly fabricated 1026 is thus greater than $$\log_2\left(\frac{N}{2^{M_1}}\right) = (\log_2 N) - M_1$$

rather than greater than $\log_2 N$, when no interconnection blocks are fabricated by traditional methods. Thus, the alternative, partially random interconnection fabrication method needs less additional microscale signal lines to compensate for orphaned and not-uniquely-addressable nanowires.

Although the present invention has been described in terms of particular embodiments, it is not intended that the invention be limited to these embodiments. Modifications within the spirit of the invention will be apparent to those skilled in the art. For example, there are many possible random interconnection fabrication methods, and non-random interconnection fabrication techniques that can be modified to introduce random or pseudorandom distributions of interconnections in a crossbar. Although the described embodiments are M2N interfaces, the methods of the present invention are also applicable to manufacture of purely nanoscale-crossbar-based nanoscale circuits and devices, as well as to hybrid microscale/nanoscale devices other than interfaces. The various controllable parameters, including the number of address signal lines, the probability of interconnection at intersections in the crossbar, the variability of interconnections/nanowire, and the number of interconnection blocks manufactured by non-random methods, can be used alone or in various combinations in order to economically produce desirable microscale/nanoscale and nanoscale circuits, interfaces, and devices.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A random microscale-to-nanoscale interface comprising:
   a number N of approximately parallel nanowires;
   a number M, where $M>\log_2 N$, of approximately parallel microscale or sub-microscale address signal lines that are not parallel with respect to the N nanowires and that form a grid-like set of intersections with the N nanowires; and
   a random or pseudorandom distribution of interconnections within the grid-like set of intersections.

2. The random microscale-to-nanoscale interface of claim 1 wherein the interconnections are two-way AND junctions based on one of:
   diodes;
   resistors; and
   transistors.

3. The random microscale-to-nanoscale interface of claim 1 wherein the number M of microscale or sub-microscale address signal lines is greater than $\log_2 N$ by an amount needed to ensure that the probability of unique addressability of all N nanowires by addresses input to the M microscale input signal lines is greater than a threshold percentage.

4. The random microscale-to-nanoscale interface of claim 3 wherein the threshold probability is greater than 0.5.

5. The random microscale-to-nanoscale interface of claim 3 wherein the threshold probability is greater than 0.6.

6. The random microscale-to-nanoscale interface of claim 3 wherein the threshold probability is greater than 0.7.

7. The random microscale-to-nanoscale interface of claim 3 wherein the threshold probability is greater than 0.8.

8. The random microscale-to-nanoscale interface of claim 1
   wherein interconnections are specifically designed and fabricated within a portion of the microscale-to-nanoscale interface including intersections between $M_1$ microscale or sub-microscale address signal lines and N nanowires;
   wherein interconnections are randomly distributed within a grid-like set of intersections spanning N nanowires and $M_2$ microscale or sub-microscale address signal lines, where $M_2>(\log 2N)-M_1$; and
   wherein $M=M_1+M_2$.

9. The random microscale-to-nanoscale interface of claim 1 wherein the probability of interconnection at a given intersection is near 0.5, to ensure near-optimal unique addressability of nanowires by addresses input to the M microscale address signal lines.

10. The random microscale-to-nanoscale interface of claim 1 wherein the probability that a given nanowire is interconnected with M/2 microscale address signal lines is greater than a threshold probability to ensure near-optimal unique addressability of nanowires by addresses input to the M microscale address signal lines.

11. The random microscale-to-nanoscale interface of claim 10 wherein the threshold probability is greater than 0.5.

12. The random microscale-to-nanoscale interface of claim 10 wherein the threshold probability is greater than 0.6.

13. The random microscale-to-nanoscale interface of claim 10 wherein the threshold probability is greater than 0.7.

14. The random microscale-to-nanoscale interface of claim 10 wherein the threshold probability is greater than 0.8.

15. A method for fabricating a nanoscale or microscale/nanoscale crossbar, the method comprising:
   fabricating a number N of approximately parallel nanowires;
   fabricating a number M, where $M>\log_2 N$, of approximately parallel microscale or sub-microscale address signal lines that are not parallel with respect to the N nanowires and that form a grid-like set of intersections with the N nanowires; and
   randomly or pseudo-randomly fabricating interconnections within the grid-like set of intersections.

16. The method of claim 15 further including fabricating, as interconnections, two-way AND junctions based on one of:
   diodes;
   resistors; and
   transistors.

17. The method of claim 15 wherein the number M of microscale or sub-microscale address signal lines is greater than $\log_2 N$ by an amount needed to ensure that the probability of unique addressability of all N nanowires by addresses input to the M microscale input signal lines is greater than a threshold percentage.

18. The method of claim 17 wherein the threshold probability is greater than 0.5.

19. The method of claim 17 wherein the threshold probability is greater than 0.6.

20. The method of claim 17 wherein the threshold probability is greater than 0.7.

21. The method of claim 17 wherein the threshold probability is greater than 0.8.

22. The method of claim 15 further including:
  specifically designing and fabricating interconnections within a portion of the microscale-to-nanoscale interface including intersections between $M_1$ microscale or sub-microscale address signal lines and N nanowires; and
  randomly or pseudo-randomly fabricating interconnections within a grid-like set of intersections spanning N nanowires and $M_2$ microscale or sub-microscale address signal lines, where $M_2>(\log 2N)-M_1$, wherein $M=M_1+M_2$.

23. The method of claim 15 further including randomly or pseudo-randomly fabricating interconnections with a probability of interconnection at a given intersection near 0.5, to ensure near-optimal unique addressability of nanowires by addresses input to the M microscale address signal lines.

24. The method of claim 15 further including randomly or pseudo-randomly fabricating interconnections with a probability that a given nanowire is interconnected with M/2 microscale address signal lines greater than a threshold probability to ensure near-optimal unique addressability of nanowires by addresses input to the M microscale address signal lines.

25. The method of claim 24 wherein the threshold probability is greater than 0.5.

26. The method of claim 24 wherein the threshold probability is greater than 0.6.

27. The method of claim 24 wherein the threshold probability is greater than 0.7.

28. The method of claim 24 wherein the threshold probability is greater than 0.8.

29. The method of claim 15 further including randomly fabricating interconnections by one of:
  introducing nanodots to either nanowires or microscale signal lines in a solution or mixture, so that the nanodots are randomly distributed in the plane of the nanowires or microscale signal lines and can subsequently form interconnections at intersections;
  randomly attaching nanodots to nanowires, the nanowires then self-assembling into a set of parallel, nanowires for interfacing to a set of parallel, roughly orthogonal microscale address signal lines;
  self-assembling block copolymers with alternating conductive and insulative regions to create random interconnections between nanowires and address signal lines; and
  employing an imprinting mask fashioned to have random pillars to introduce random holes within a layer of insulative polymer, and depositing metal or other conductive or semiconductive substances into the holes to form a random array of conductive dots that remain following removal of the imprinting mask.

* * * * *

UNITED STATES PATENT AND TRADEMARK OFFICE
CERTIFICATE OF CORRECTION

PATENT NO. : 7,211,503 B2  
APPLICATION NO. : 11/065929  
DATED : May 1, 2007  
INVENTOR(S) : Yong Chen et al.

Page 1 of 1

It is certified that error appears in the above-identified patent and that said Letters Patent is hereby corrected as shown below:

In column 7, line 47, delete "$\exists j \therefore a_i a_j \neq I a_j$" and insert -- $\exists j \therefore a_i \otimes a_j = I \otimes a_j$ --, therefor.

In column 7, line 50, before "represents" insert -- $\otimes$ --.

In column 7, line 55, delete "$\forall j \neq i, a_i a_j \neq I a_j$" and insert -- $\forall j \neq i, a_i \otimes a_j \neq I \otimes a_j$ --, therefor.

Signed and Sealed this

Sixth Day of October, 2009

David J. Kappos
*Director of the United States Patent and Trademark Office*